United States Patent
Mitzlaff (10) Patent No.: US 6,735,419 B2
(45) Date of Patent: May 11, 2004

(54) HIGH EFFICIENCY WIDEBAND LINEAR WIRELESS POWER AMPLIFIER

(75) Inventor: James E. Mitzlaff, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 505 days.

(21) Appl. No.: 09/765,747

(22) Filed: Jan. 18, 2001

(65) Prior Publication Data

US 2002/0094795 A1 Jul. 18, 2002

(51) Int. Cl.[7] .............................................. H01Q 11/12
(52) U.S. Cl. ................... 455/127.1; 455/114.3; 375/297
(58) Field of Search ................... 455/245.1–245.2, 455/127.1, 126, 341, 136, 138, 139, 149, 127.2–127.3, 117, 63.1, 114.3; 375/297, 345; 379/307; 330/149, 129, 275, 285, 136, 151, 297, 107, 298, 155, 110, 289; 370/491, 493, 262, 264

(56) References Cited

U.S. PATENT DOCUMENTS

| | | | | |
|---|---|---|---|---|
| 4,329,657 A | * | 5/1982 | Kamiya | 330/297 |
| 4,521,742 A | * | 6/1985 | Edvardsen | 330/289 |
| 5,138,274 A | * | 8/1992 | Nakanishi et al. | 330/136 |
| 5,142,240 A | * | 8/1992 | Isota et al. | 330/149 |
| 5,420,536 A | * | 5/1995 | Faulkner et al. | 330/149 |
| 5,524,286 A | * | 6/1996 | Chiesa et al. | 455/126 |
| 5,742,201 A | * | 4/1998 | Eisenberg et al. | 330/2 |
| 5,936,464 A | | 8/1999 | Grondahl | |
| 6,043,707 A | | 3/2000 | Budnik | |
| 6,107,872 A | * | 8/2000 | Schoepe et al. | 327/560 |
| 6,107,880 A | | 8/2000 | Shaw | |
| 6,157,253 A | | 12/2000 | Sigmon et al. | |
| 6,437,641 B1 | * | 8/2002 | Bar-David | 330/10 |

* cited by examiner

Primary Examiner—Edward F. Urban
Assistant Examiner—C. Chow
(74) Attorney, Agent, or Firm—Steven A. May (57) ABSTRACT

In a linear amplification system, an input signal is amplified to produce a substantially linear amplified output signal without causing significant intermodulation distortion or spectral growth. An envelope detector determines an envelope detector voltage from the input signal. A tracking power supply determines a supply voltage based on the envelope detector voltage. An input signal conditioner determines, in response to the supply voltage, a corresponding phase adjustment and a corresponding gain adjustment and modifies the input signal using the corresponding phase adjustment and the corresponding gain adjustment to produce a conditioned input signal. A power amplifier operates using the supply voltage and amplifies the conditioned input signal to produce the amplified output signal. The corresponding phase adjustment and the corresponding gain adjustment are separately and independently determined from mappings of a phase response and an amplitude response, respectively, of the power amplifier to a range of variation of the supply voltage.

27 Claims, 4 Drawing Sheets

HIGH EFFICIENCY WIDEBAND LINEAR WIRELESS POWER AMPLIFIER

FIELD OF THE INVENTION

The present invention relates, in general, to power amplifiers and, more particularly, to an apparatus, method and system for high efficiency, wideband linear power amplification in wireless applications, such as broadband CDMA and 3G cellular systems.

BACKGROUND OF THE INVENTION

Power amplifiers for wireless transmission applications, such as radio frequency ("RF") power amplifiers, are utilized in a wide variety of communications and other electronic applications. Ideally, the input-output transfer function of a power amplifier should be linear, with a perfect replica of the input signal, increased in amplitude, appearing at the output of the power amplifier.

In addition, for greater efficiency, various RF systems, such as cellular systems, attempt to run power amplifiers at or near their saturation levels, in which the actual output power of the amplifier is just below its maximum rated power output level. This power output level is generally related to the supply voltage (or supply power) to the power amplifier, such that a greater supply voltage will produce a correspondingly greater output power from the amplifier; for higher power input signals, a correspondingly greater actual power output is required to maintain the amplifier at or near saturation. In various prior art amplifiers, however, the supply voltage to the power amplifier is fixed. Given a typical usage situation in which actual power output from the amplifier may vary by a range of several orders of magnitude, use of a fixed supply voltage is highly inefficient, as output power is often an order of magnitude below its maximum, and the power amplifier is not maintained at or near its saturation levels.

Various techniques have evolved to vary the supply voltage to maintain the power amplifier at or near saturation. One such technique is power supply modulation ("PSM") which varies, or modulates, the supply voltage to the power amplifier, in order to maintain the power amplifier at or near saturation while the input signal varies over time. For PSM, the supply voltage of the amplifier tracks the input signal variations, typically utilizing a signal detector in conjunction with a tracking power supply. In the prior art, however, the various PSM techniques have generally been limited to narrowband applications, or have poor efficiency characteristics.

For example, one prior art PSM technique, known as Envelope Elimination Restoration ("EER"), utilizes a limiter to provide an essentially constant drive level to the power amplifier to maintain the amplifier in a hard saturation state and increase efficiency. Use of the limiter, however, greatly expands the bandwidth of the RF signal input to the amplifier, and requires very accurate tracking of the input signal envelope, with a power supply switching frequency approximately ten times greater than the bandwidth of the RF input signal. As these switching frequencies increase, the transistors within the tracking power supply become less efficient, resulting in excessive power losses. The resulting bandwidth expansion of the limiter also requires the bandwidth capability of the amplifier to be significantly greater than the input signal bandwidth, limiting the EER configuration to narrow bandwidth applications, such as amplitude modulation ("AM") RF broadcasts.

Another prior art PSM technique, known as Envelope Tracking ("ET"), does not utilize the limiter of EER, and consequently may be suitable for higher bandwidth applications. Use of envelope tracking, however, introduces significant non-linearities in the output signal of the power amplifier, such as gain distortions, phase distortions, and other voltage parasitics. More particularly, while power amplifiers comprised of LDMOS (laterally diffused MOSFET) circuitry have good linearity with respect to input power, such LDMOS and other types of power amplifiers have large variations in gain and phase as a function of supply voltage. When PSM techniques are utilized for amplification efficiency, these non-linearities cause intermodulation distortion ("IMD") in multicarrier frequency division multiple access ("FDMA") or time division multiple access ("TDMA") systems, and spectral growth in code division multiple access ("CDMA") systems. These various distortions also degrade output signal quality and may have other detrimental effects, such as decreased data throughput.

As a consequence, a need remains for an apparatus, method and system to provide high efficiency power amplification in broadband (or wideband) applications, such as 3G and other wideband cellular or RF applications. Such an apparatus, method and system should provide linear power amplification, minimizing any phase, gain, and other distortions. In addition, such an apparatus, method and system should be cost-effective and capable of implementation in existing RF transmission systems, such as existing cellular base stations.

SUMMARY OF THE INVENTION

An apparatus, method and system are provided for power amplification of an input signal to produce a substantially linear amplified output signal, for broadband wireless applications such as 3G cellular and broadband CDMA systems, without creating significant intermodulation distortion or spectral growth.

Figure 1:
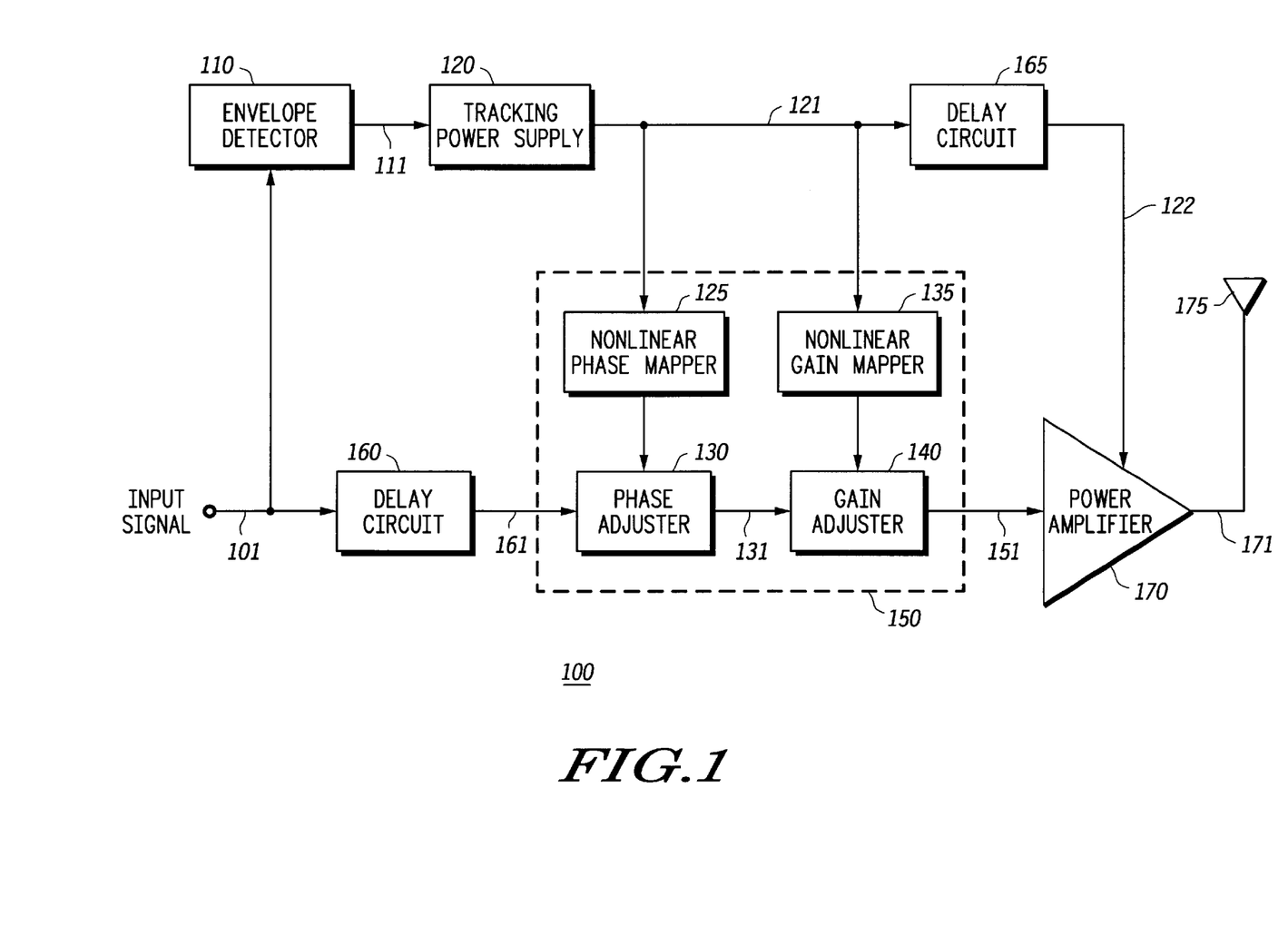
FIG. 1 is a block diagram illustrating apparatus and system embodiments to provide for high efficiency, wideband linear power amplification in wireless applications in accordance with the present invention.

The preferred system 100 embodiment includes an envelope detector 110, a tracking power supply 120, an input signal conditioner 150, and a power amplifier 170. The envelope detector 110 is utilized to determine an envelope detector voltage from the input signal, and the tracking power supply 120 is utilized to determine a supply voltage from the envelope detector voltage, preferably as a substantially quantized version of the envelope detector voltage. The supply voltage is utilized to maintain the power amplifier 170 at or near its saturation level. An input signal conditioner 150 is utilized to predistort or condition the input signal, to form a conditioned input signal, such that when the conditioned input signal is amplified by the power amplifier 170 using the supply voltage, the amplified output signal is a substantially linear, amplified replica of the input signal.

In response to the supply voltage, the input signal conditioner 150 determines a corresponding phase adjustment and a corresponding gain adjustment. In the preferred embodiment, the corresponding phase adjustment is selected from a plurality of predetermined phase adjustments in response to the supply voltage, and the corresponding gain adjustment is selected from a plurality of predetermined gain adjustments, also in response to the supply voltage. The plurality of predetermined phase adjustments and the plurality of predetermined gain adjustments are determined separately and independently, preferably from respective piecewise linear mappings of a phase response and a gain response of the power amplifier to a range of variation of the supply voltage. The input signal conditioner then modifies the input signal using the corresponding phase adjustment and the corresponding gain adjustment to produce the conditioned input signal.

The preferred system 100 embodiment also includes a first delay circuit 160, to synchronize the input signal with the supply voltage, and a second delay circuit 165 to synchronize the supply voltage with the conditioned input signal.

The apparatus, method and system embodiments of the present invention provide for high efficiency power amplification in broadband (or wideband) applications, such as 3G and other wideband cellular or RF applications, without significant bandwidth limitations, without intermodulation distortion, and without spectral growth. The various embodiments of the present invention effectively provide linear power amplification, minimizing any phase, gain, and other distortions. In addition, the apparatus, method and system of the present invention are cost-effective and capable of implementation in existing RF transmission systems, such as existing cellular base stations.

Numerous other advantages and features of the present invention will become readily apparent from the following detailed description of the invention and the embodiments thereof, from the claims and from the accompanying drawings.

DETAILED DESCRIPTION OF THE INVENTION

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, a need remains for accurate, linear high efficiency power amplification for broadband or wideband applications. The apparatus, method and system embodiments of the present invention provide for such high efficiency power amplification in broadband (or wideband) applications, such as 3G and other wideband cellular or RF applications, without significant bandwidth limitations, without intermodulation distortion, and without spectral growth. The various embodiments of the present invention effectively provide linear power amplification, minimizing any phase, gain, and other distortions. In addition, the apparatus, method and system of the present invention are cost-effective and capable of implementation in existing RF transmission systems, such as existing cellular base stations.

FIG. 1 is a block diagram illustrating apparatus 150 and system 100 embodiments to provide for high efficiency, wideband linear power amplification in wireless applications in accordance with the present invention. The system 100 is preferably included within a base station or other transceiver for wireless communication, such as for 3G cellular systems, wideband CDMA, or other cellular, PCS or RF communication systems. The system 100 includes an input signal conditioner apparatus 150, an envelope detector 110, a tracking power supply 120, and a power amplifier ("PA") 170. The power amplifier 170 is preferably coupled to an antenna (or antenna array) 175 for wireless transmission of an amplified, output signal on line 171. As discussed in greater detail below, to provide more accurate synchronization of the supply voltage to the power amplifier 170 (on line 122) with a conditioned input signal, the system 100 also preferably includes first and second delay circuits 160 and 165, respectively.

Continuing to refer to FIG. 1, the envelope detector 110 and tracking power supply 120 are utilized to track the input signal (on line 101) and provide a variable supply voltage (on line 122) to the power amplifier 170, to maintain the power amplifier 170 at or near saturation and increase the efficiency of the power amplifier over a wide range of variation of the input signal. The input signal conditioner apparatus 150, in accordance with the present invention, includes a nonlinear phase mapper 125, a phase adjuster 130, a nonlinear gain mapper 135, and a gain adjuster 140. As discussed in greater detail below, the input signal conditioner apparatus 150 will essentially predistort (or condition) an input signal (on line 161) (which has been delayed (by first delay circuit 160)), to provide a conditioned input signal to the power amplifier 170 (on line 151), to counteract any phase and gain distortions introduced within the power amplifier 170 from variations in the supply voltage (on lines 121 and 122) provided by the tracking power supply 120. As a consequence, the use of the input signal conditioner apparatus 150, in conjunction with the use of the envelope detector 110 and tracking power supply 120 to vary the supply voltage to the power amplifier 170, minimizes phase and gain distortions in the amplified output signal, and provides for effectively linear, high efficiency power amplification in broadband applications.

Figure 2:
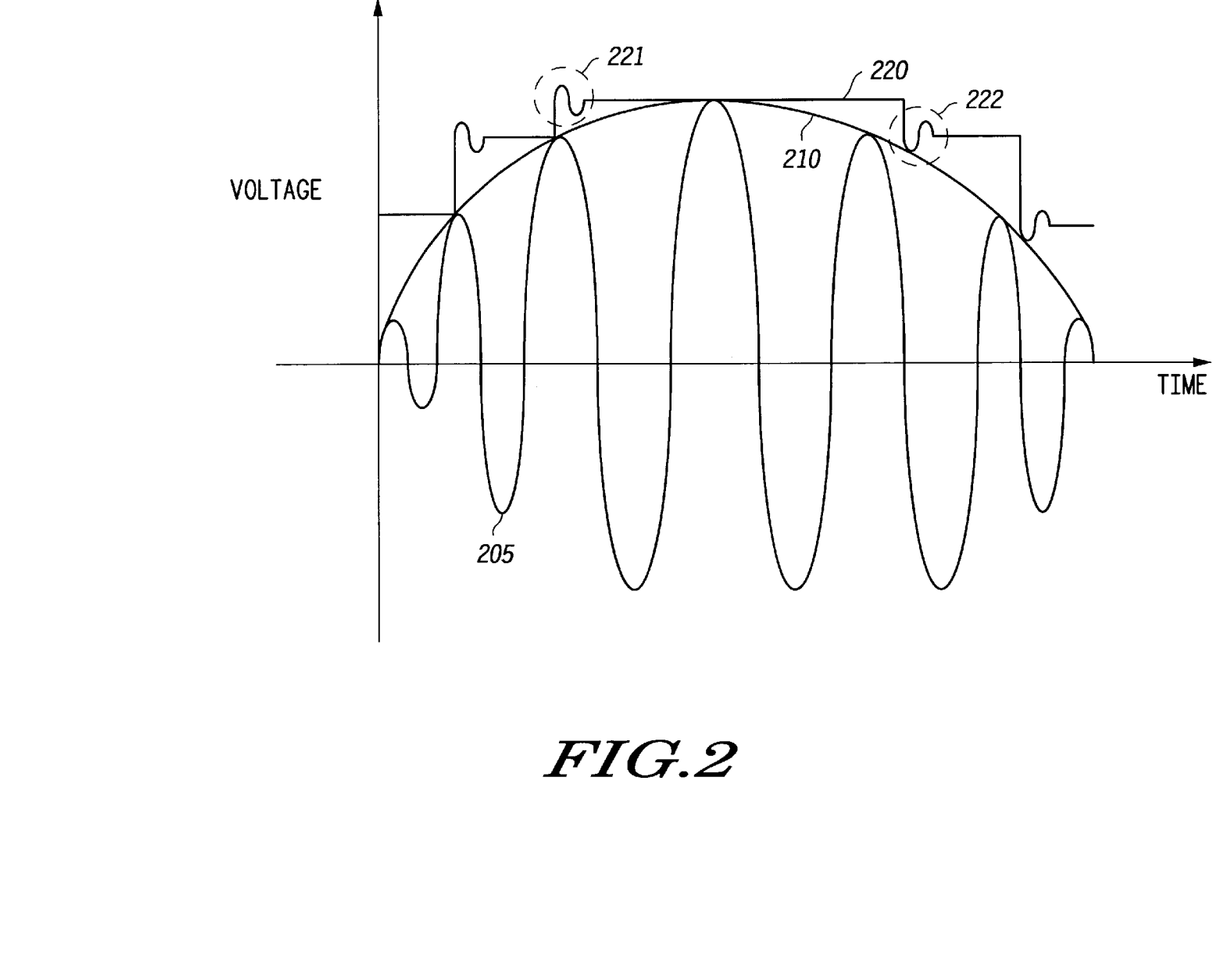
FIG. 2 is a graphical diagram illustrating an exemplary input signal voltage, an exemplary envelope detector voltage, and an exemplary tracking power supply voltage, for high efficiency, wideband linear power amplification in wireless applications in accordance with the present invention.

FIG. 2 is a graphical diagram illustrating an exemplary input signal voltage (205), an exemplary envelope detector voltage (210), and an exemplary tracking power supply voltage (220), for high efficiency, wideband linear power amplification in wireless applications in accordance with the present invention. Referring to both FIGS. 1 and 2, the envelope detector 110 tracks or detects the "envelope" of an input signal (on line 101), such as envelope detecting the exemplary input signal voltage 205, to produce an envelope detector voltage or signal (output on line 111), such as exemplary envelope detector voltage 210. A tracking power supply 120 is then utilized to further track (or quantize) the envelope detector voltage (e.g. envelope detector voltage 210), and provide a higher or greater level of supply voltage and current to the power amplifier 170, in comparison to a level typically available directly from an envelope detector 110. In the preferred embodiment, for faster operation and for greater bandwidth capability (e.g., to 10 MHz or more), the tracking power supply 120 is stepped or switched, providing a quantized power supply voltage or signal (on line 121 and, following second delay circuit 165, on line 122) to power amplifier 170, such as exemplary power supply voltage 220. As illustrated in FIG. 2, the exemplary power supply voltage 220 output from the tracking power supply 120 is approximately a stepped or quantized version or replica of the exemplary envelope detector voltage 210, and may also include various ringing, overshoot, and other voltage distortions, as illustrated by distortions 221 and 222, for example. By tracking the input signal (on line 101), the envelope detector 110 and tracking power supply 120 provide a variable supply voltage to the power amplifier 170 (on line 122), and enable the power amplifier 170 to be maintained at or near saturation over a wide range of magnitudes of the input signal, to provide for highly efficient amplification of the input signal.

As mentioned above, however, such envelope tracking by the envelope detector 110 and tracking power supply 120, to provide a variable supply voltage to the power amplifier 170, typically introduces significant non-linearities in the output signal (on line 171) of the power amplifier 170, such as gain distortions, phase distortions, and other parasitics. More particularly, variations in gain and phase in the output signal (on line 171) of the power amplifier 170 are correlated to or otherwise occur as a function of the supply voltage (on line 122). These variations in gain and phase of the output signal of the power amplifier 170, as a function of supply voltage, may be calibrated or otherwise empirically determined, preferably during the initial design or manufacture of the power amplifier 170, and may be utilized to create the nonlinear phase and gain mappings (illustrated in FIGS. 3 and 4, for example) respectively implemented in nonlinear phase mapper 125 and nonlinear gain mapper 135.

Figure 3:
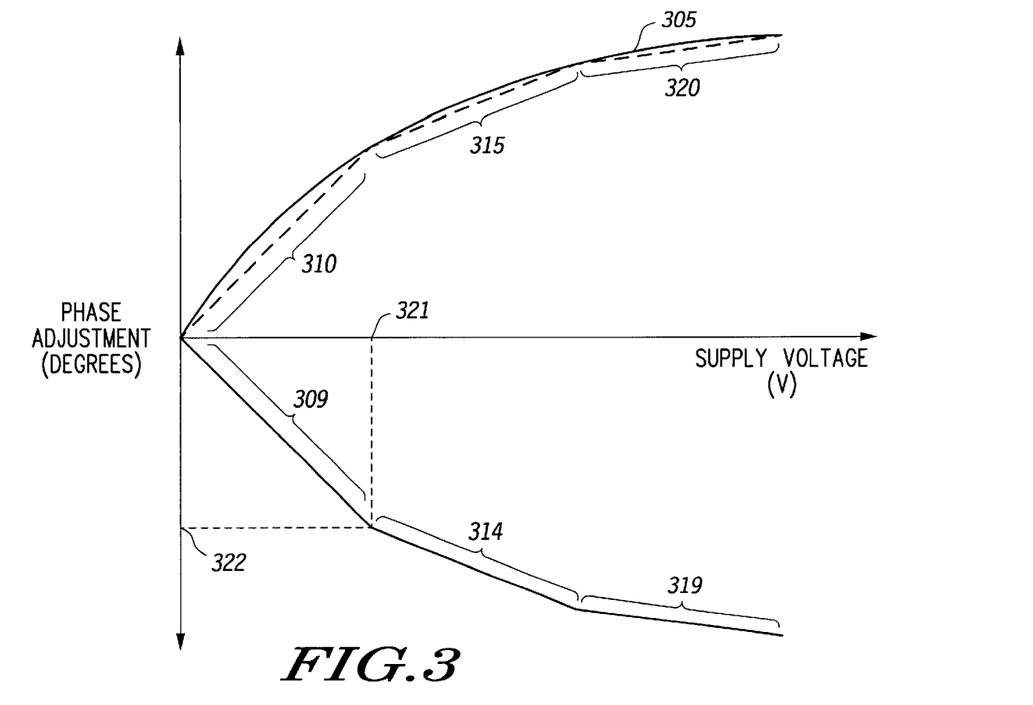
FIG. 3 is a graphical diagram illustrating an exemplary nonlinear phase variation, an exemplary piecewise linear mapping to the nonlinear phase variation, and an exemplary piecewise linear mapping for phase adjustments for high efficiency, wideband linear power amplification in wireless applications in accordance with the present invention.

FIG. 3 is a graphical diagram illustrating an exemplary nonlinear phase variation (305), an exemplary piecewise linear mapping to the nonlinear phase variation (dashed lines 310, 315 and 320), and an exemplary piecewise linear mapping for phase adjustments (lines 309, 314 and 319), with respect to supply voltage, for high efficiency, wideband linear power amplification in wireless applications in accordance with the present invention. As mentioned above, the phase of the amplified output signal from the power amplifier 170 (on line 171), in comparison to the input signal (on line 101), generally varies as a nonlinear function of the supply voltage to the power amplifier (on line 122), and may be calibrated or otherwise determined, to provide, for example, exemplary nonlinear phase variation 305. In the preferred embodiment, a piecewise linear approximation is made to the determined nonlinear phase variation, resulting in, for example, an exemplary piecewise linear mapping to the nonlinear phase variation (dashed lines 310, 315 and 320). To predistort the input signal to accommodate this phase variation, a distortion opposite to the piecewise linear mapping to the nonlinear phase variation is utilized, resulting in an exemplary piecewise linear mapping for phase adjustments (illustrated as solid lines 309, 314 and 319 in FIG. 3). In the preferred embodiment, a plurality of corresponding phase adjustments are stored in the non-linear phase mapper 125 as a predetermined set of coefficients corresponding to particular supply voltages. As a consequence, for any given supply voltage (or range of supply voltages) to the power amplifier 170, such as supply voltage level 321, a corresponding phase adjustment may be determined by the nonlinear phase mapper 125, such as phase adjustment 322. This phase adjustment, determined by the nonlinear phase mapper 125, will be utilized by the phase adjuster 130 (in the input signal conditioner 150) to predistort or condition the phase of the input signal, to form an intermediate conditioned input signal (on line 131 of FIG. 1); this intermediate conditioned input signal is then gain conditioned (below), to thereby create a conditioned input signal, (i.e., the input signal having been predistorted for both phase and gain variations), which when amplified using the supply voltage provided by the tracking power supply 120, will provide an output signal which is generally or approximately an amplified, linear replica of the input signal.

Figure 4:
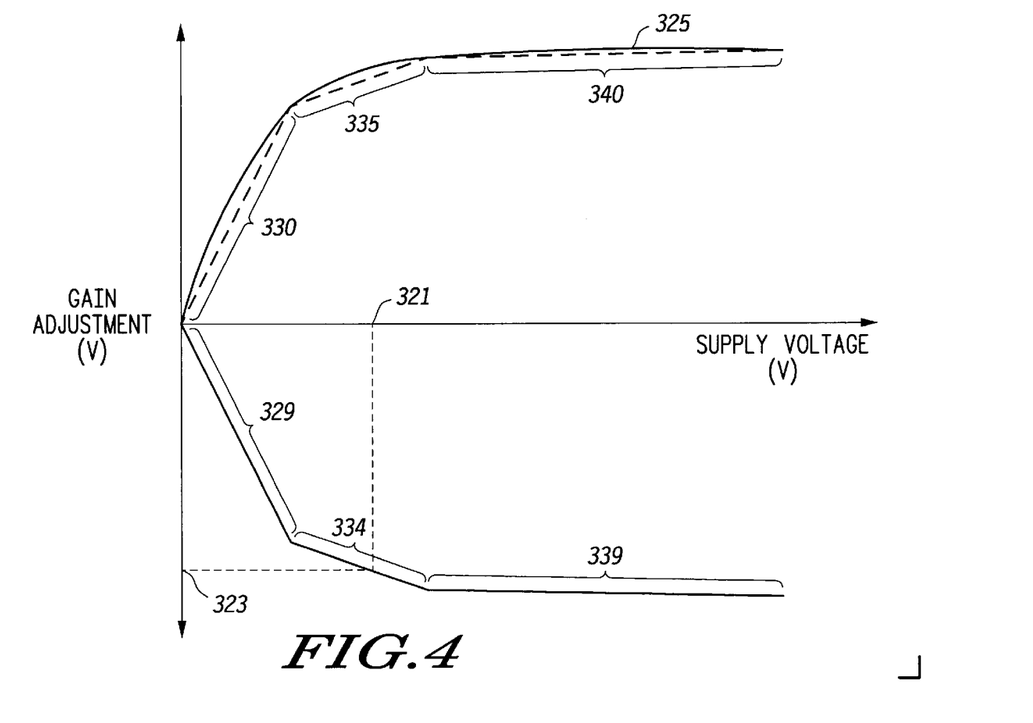
FIG. 4 is a graphical diagram illustrating an exemplary nonlinear gain adjustment, an exemplary piecewise linear mapping to the nonlinear gain variation, and an exemplary piecewise linear mapping for gain adjustments for high efficiency, wideband linear power amplification in wireless applications in accordance with the present invention.

FIG. 4 is a graphical diagram illustrating an exemplary nonlinear gain (or amplitude) variation (325), an exemplary piecewise linear mapping to the nonlinear gain variation (dashed lines 330, 335 and 340), and an exemplary piecewise linear mapping for gain adjustments (lines 329, 334 and 339), with respect to supply voltage, for high efficiency, wideband linear power amplification in wireless applications in accordance with the present invention. As mentioned above, the gain of the amplified output signal from the power amplifier 170 (on line 171), in comparison to the input signal (on line 101), generally varies as a nonlinear function of the supply voltage to the power amplifier (on line 122), and may be calibrated or otherwise determined, to provide, for example, exemplary nonlinear gain variation 325. In the preferred embodiment, a piecewise linear approximation is also made to the determined nonlinear gain variation, resulting in, for example, an exemplary piecewise linear mapping to the nonlinear gain variation (dashed lines 330, 335 and 340). To predistort the input signal to accommodate this gain variation, a distortion opposite to the piecewise linear mapping to the nonlinear gain variation is utilized, resulting in an exemplary piecewise linear mapping for gain adjustments (illustrated as solid lines 329, 334 and 339 in FIG. 4). In the preferred embodiment, a plurality of corresponding gain adjustments are stored in the non-linear gain mapper 135 as a predetermined set of coefficients corresponding to particular supply voltages. As a consequence, for any given supply voltage (or range of supply voltages) to the power amplifier 170, such as supply voltage level 321, a corresponding gain adjustment may be determined by the nonlinear gain mapper 135, such as gain adjustment 323. This gain adjustment, determined by the nonlinear gain mapper 135, will be utilized by the gain adjuster 140 (in the input signal conditioner 150) to predistort or condition the gain of the intermediate conditioned input signal (i.e., the input signal following its phase adjustment on line 131 (above)), to thereby create the conditioned input signal. The conditioned input signal, which effectively is the input signal having been predistorted for both phase and gain variations, when amplified using the supply voltage provided by the tracking power supply 120, will provide an output signal which is generally or approximately an amplified, linear replica of the input signal.

It should be noted that the nonlinear phase and gain adjustments, and their piecewise linear approximations, will generally be different from each other (e.g., a nonlinear gain variation, such as exemplary nonlinear gain variation 325, will have a different calibration (graph or curve), and different piecewise linear approximations, than a nonlinear phase variation, such as exemplary nonlinear phase variation 305). As a consequence, in the preferred embodiment, the respective plurality of nonlinear phase adjustments and plurality of nonlinear gain adjustments, as functions of supply voltage, are each calibrated or otherwise determined separately and independently. It should also be noted that the phase and gain adjustments may occur in any order, in addition to that illustrated in FIG. 1, such as a gain adjustment to create an intermediate conditioned input signal followed by a phase adjustment, or a gain adjustment occurring concurrently with a phase adjustment.

Referring again to FIG. 1, for any given input signal at any given time, the envelope detector 110 tracks or detects the "envelope" of the input signal (on line 101), to produce an envelope detector voltage (output on line 111). The tracking power supply 120 is then utilized to further track (or quantize) the envelope detector voltage, and provide a higher or greater level of supply voltage and current to the power amplifier 170. In the preferred embodiment, the tracking power supply 120 is stepped or switched, providing a quantized power supply voltage (on line 121 and, following second delay circuit 165, on line 122) to power amplifier 170. In the preferred embodiment, three steps or quantizations are utilized, as any increased efficiency available from additional steps would generally be lost from an increase in complexity of the tracking power supply 120. To accommodate any delay incurred during such tracking by the envelope detector 110 and tracking power supply 120, first delay circuit 160 is utilized to delay and thereby synchronize the input signal (on line 161) with a corresponding supply voltage on line 121.

The supply voltage on line 121 is input into both the nonlinear phase mapper 125 and nonlinear gain mapper 135. As indicated above, for any given value of the supply voltage (on line 121), the nonlinear phase mapper 125 and nonlinear gain mapper 135 provide a corresponding phase adjustment and a corresponding gain adjustment, respectively. Utilizing the corresponding phase adjustment and the corresponding gain adjustment, respectively, the phase adjuster 130 and the gain adjuster 140 modify the (delayed) input signal (on line 161), to provide a predistorted or conditioned input signal (on line 151) to the power amplifier 170. As mentioned above, such gain and phase conditioning may occur in any order, and if occurring sequentially, there will be an intermediate conditioned signal, e.g., an intermediate phase conditioned input signal followed by the gain conditioning to create the conditioned input signal, or an intermediate gain conditioned input signal followed by the phase conditioning to create the conditioned input signal.

To accommodate any delay incurred during such phase and gain determinations and adjustments by the input signal conditioner 150, a second delay circuit 165 is utilized to delay and thereby synchronize the supply voltage (on line 122) with the corresponding conditioned input signal (on line 151). The supply voltage to the power amplifier 170 (on line 122) will then be the same value as the supply voltage (on line 121) previously provided as inputs to the nonlinear phase and gain mappers 125 and 135 and utilized to determine the phase and gain adjustments to predistort the input signal to produce the conditioned input signal. As a consequence, the amplification of the conditioned input signal by the power amplifier 170, utilizing the synchronized supply voltage on line 122, will produce a generally linear, amplified replica, without phase or gain distortions, of the input signal, on line 171. The amplified signal may then be utilized, for example, for broadcast via antenna 175. In addition, utilizing the variable supply voltage, determined at any instant of time by the corresponding tracking of the input signal, allows the maximum output power of the power amplifier 170 to be varied accordingly, thereby allowing the power amplifier to be maintained at or near saturation over a wide range of input signal power levels.

A particularly significant and novel feature of the present invention is the input of the supply voltage, on line 121, from the tracking power supply 120, into the input signal conditioner 150, rather than input of the envelope detector voltage (on line 111) from the envelope detector 110. As a consequence, the input signal conditioner 150 may also provide phase and gain adjustments, in the conditioned input signal, to additionally accommodate overshoot, ringing and other nonlinear distortions, such as distortions 221 and 222 illustrated in FIG. 2, which would otherwise detrimentally affect the linearity characteristics of the amplified output signal. In addition, this use of a quantized tracking power supply 120 avoids the bandwidth limitations of a continuously tracking power supply, and allows use of the system 100 for wideband applications, such as a 10 MHz or greater bandwidth.

Figure 5:
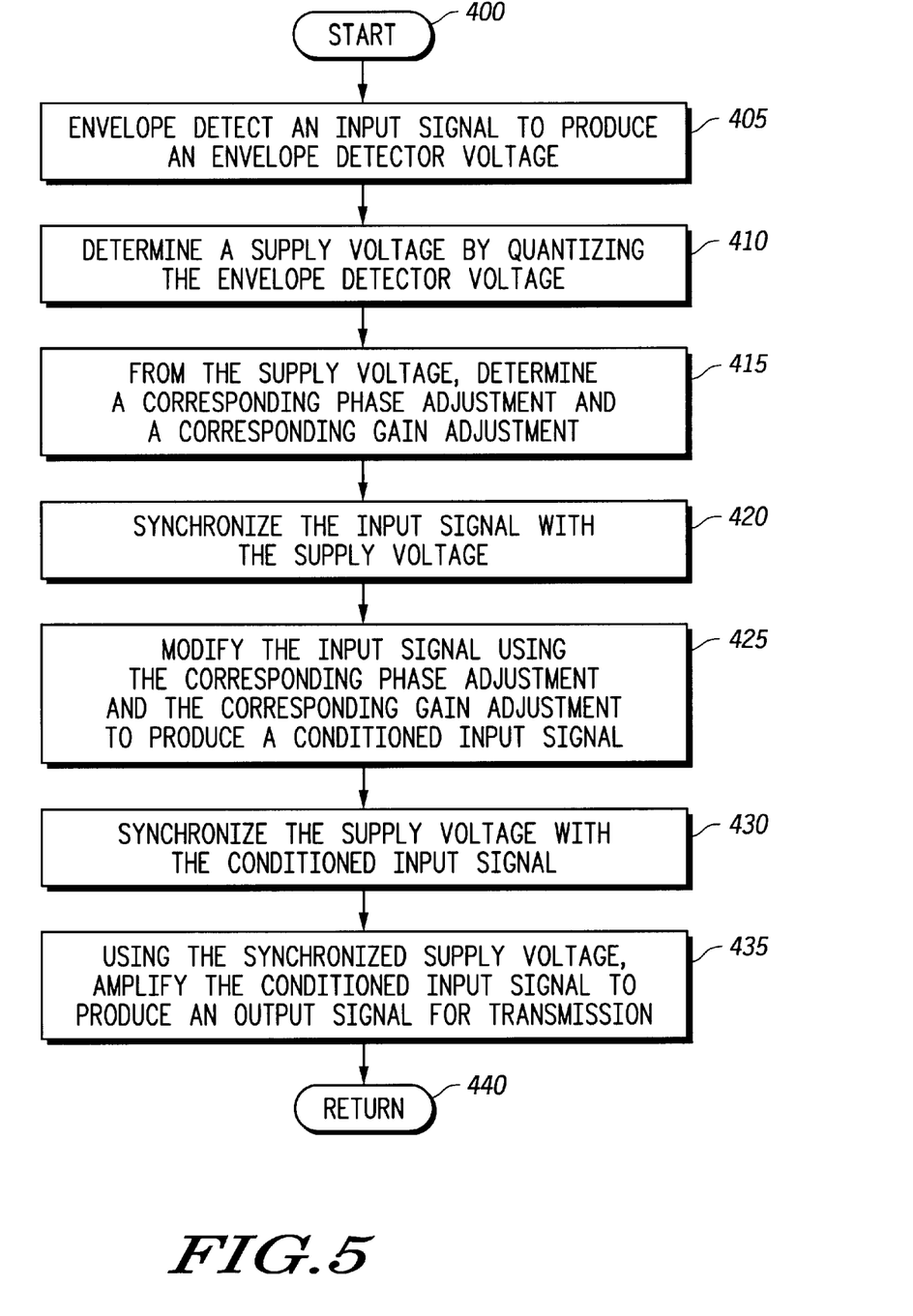
FIG. 5 is a flow diagram illustrating a method embodiment to provide for high efficiency, wideband linear power amplification in wireless applications in accordance with the present invention.

FIG. 5 is a flow diagram illustrating a method embodiment to provide for high efficiency, wideband linear power amplification in wireless applications, and provides a useful summary of the present invention. In the preferred embodiment, each step of the method (other than start step 400 and return step 440) runs or occurs essentially continuously, for as long as an input signal is to be amplified, as may be illustrated by the ongoing or continuous operation of the system 100 circuitry of FIG. 1. Referring to FIG. 5, the method begins, start step 400, with envelope tracking an input signal to produce an envelope detector voltage (or signal), step 405, preferably by envelope detector 110. Next, in step 410, the envelope detector voltage is quantized to produce a supply voltage (or signal), preferably by the tracking power supply 120. From the supply voltage, a corresponding phase adjustment and a corresponding gain adjustment are determined, step 415, preferably by the respective nonlinear phase mapper 125 and the nonlinear gain mapper 135. As mentioned above, in the preferred embodiment, for an entire range of potential supply voltages, a plurality of corresponding phase adjustments and a plurality of corresponding gain adjustments are calibrated or otherwise determined, and preferably stored as corresponding coefficients in the nonlinear phase mapper 125 and the nonlinear gain mapper 135, respectively.

Continuing to refer to FIG. 5, the input signal is synchronized with the supply voltage, step 420, preferably by first delay circuit 160. Next, the synchronized (or delayed) input signal is modified using the corresponding phase adjustment and the corresponding gain adjustment, to produce a conditioned input signal, step 425, preferably by the phase adjuster 130 and the gain adjuster 140, respectively. For example, in the preferred embodiment, the phase adjuster 130 and the gain adjuster 140 may be implemented as multipliers, to multiply the input signal respectively by corresponding phase adjustment coefficients and corresponding gain adjustment coefficients, to produce the conditioned input signal on line 151. The supply voltage, for the power amplifier 170, is synchronized with the conditioned input signal, step 430, preferably by the second delay circuit 165. Using the synchronized supply voltage, the conditioned input signal is amplified, such as by power amplifier 170, to produce an output signal for transmission on line 171, step 435. The method may end, return step 440, when there is no longer any input signal requiring amplification but, as mentioned above, in the preferred embodiment, each step of the method (other than start step 400 and return step 440) runs or occurs effectively continuously.

As may be apparent from the discussion above, there are numerous advantages of the various embodiments of the present invention. The apparatus, method and system embodiments of the present invention provide for high efficiency power amplification in broadband (or wideband) applications, such as 3G and other wideband cellular or RF applications, without significant bandwidth limitations, without intermodulation distortion, and without spectral growth. The various embodiments of the present invention effectively provide linear power amplification, minimizing any phase, gain, and other distortions. In addition, the apparatus, method and system of the present invention are cost-effective and capable of implementation in existing RF transmission systems, such as existing cellular base stations.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A system for power amplification of an input signal to produce an amplified output signal, the system comprising:
   an envelope detector, the envelope detector operable to determine an envelope detector voltage from the input signal;
   a tracking power supply operably coupled to the envelope detector, the tracking power supply operable to determine a supply voltage from the envelope detector voltage;
   an input signal conditioner operably coupled to the tracking power supply, the input signal conditioner operative, in response to the supply voltage, to determine a corresponding phase adjustment and a corresponding gain adjustment, the input signal conditioner further operative to modify the input signal using the corresponding phase adjustment and the corresponding gain adjustment to produce a conditioned input signal; and
   a power amplifier, the power amplifier operably coupled to the tracking power supply for reception of the supply voltage and operably coupled to the input signal conditioner to amplify the conditioned input signal to produce the amplified output signal.

2. The system of claim 1, further comprising:
   a first delay circuit operably coupled to the input signal conditioner to synchronize the input signal to the supply voltage from the tracking power supply.

3. The system of claim 1, further comprising:
   a second delay circuit operably coupled to the tracking power supply to synchronize the supply voltage to the conditioned input signal from the input signal conditioner.

4. The system of claim 1, wherein the tracking power supply is further operative to determine the supply voltage as a substantially quantized version of the envelope detector voltage.

5. The system of claim 1, wherein the amplified output signal is a substantially linear replica of the input signal.

6. The system of claim 1, wherein the input signal conditioner is further operative to select the corresponding phase adjustment from a plurality of predetermined phase adjustments, the plurality of predetermined phase adjustments determined from a mapping of a phase response of the power amplifier to a range of variation of the supply voltage.

7. The system of claim 6, wherein the mapping of the phase response is piecewise linear.

8. The system of claim 1, wherein the input signal conditioner is further operative to select the corresponding gain adjustment from a plurality of predetermined gain adjustments, the plurality of predetermined gain adjustments determined from a mapping of an amplitude response of the power amplifier to a range of variation of the supply voltage.

9. The system of claim 6, wherein the mapping of the amplitude response is piecewise linear.

10. The system of claim 1, wherein the input signal conditioner further comprises:
    a first nonlinear mapper operably coupled to the tracking power supply to receive the supply voltage, the first nonlinear mapper operative to select the corresponding phase adjustment from a plurality of predetermined phase adjustments in response to the supply voltage, the plurality of predetermined phase adjustments determined from a mapping of a phase response of the power amplifier to a range of variation of the supply voltage;
    a phase adjuster coupled to the first nonlinear mapper, the phase adjuster operative to modify a phase component of the input signal using the corresponding phase adjustment to produce an intermediate conditioned input signal;
    a second nonlinear mapper operably coupled to the tracking power supply to receive the supply voltage, the second nonlinear mapper operative to select the corresponding gain adjustment from a plurality of predetermined gain adjustments in response to the supply voltage, the plurality of predetermined gain adjustments determined from a mapping of an amplitude response of the power amplifier to a range of variation of the supply voltage; and
    a gain adjuster coupled to the second nonlinear mapper and to the phase adjuster, the gain adjuster operative to modify a gain component of the intermediate conditioned input signal using the corresponding gain adjustment to produce the conditioned input signal.

11. The system of claim 1, wherein the input signal conditioner further comprises:
    a first nonlinear mapper operably coupled to the tracking power supply to receive the supply voltage, the first nonlinear mapper operative to select the corresponding gain adjustment from a plurality of predetermined gain adjustments in response to the supply voltage, the plurality of predetermined gain adjustments determined from a mapping of an amplitude response of the power amplifier to a range of variation of the supply voltage;
    a gain adjuster coupled to the first nonlinear mapper, the gain adjuster operative to modify a gain component of the input signal using the corresponding gain adjustment to produce an intermediate conditioned input signal;
    a second nonlinear mapper operably coupled to the tracking power supply to receive the supply voltage, the second nonlinear mapper operative to select the corresponding phase adjustment from a plurality of predetermined phase adjustments in response to the supply voltage, the plurality of predetermined phase adjustments determined from a mapping of a phase response of the power amplifier to a range of variation of the supply voltage; and
    a phase adjuster coupled to the second nonlinear mapper and to the gain adjuster, the phase adjuster operative to modify a phase component of the intermediate conditioned input signal using the corresponding phase adjustment to produce the conditioned input signal.

12. A method for power amplification of an input signal to produce an amplified output signal, the method comprising:
    (a) envelope detecting the input signal to determine an envelope detector voltage;
    (b) determining a supply voltage from the envelope detector voltage;
    (c) in response to the supply voltage, determining a corresponding phase adjustment and a corresponding gain adjustment;
    (d) modifying the input signal using the corresponding phase adjustment and the corresponding gain adjustment to produce a conditioned input signal; and
    (e) using the supply voltage, amplifying the conditioned input signal to produce the amplified output signal.

13. The method of claim 12, wherein step (d) further comprises:
    synchronizing the input signal to the supply voltage.

14. The method of claim 12, wherein step (e) further comprises:
    synchronizing the supply voltage to the conditioned input signal.

15. The method of claim 12, wherein the supply voltage is determined as a substantially quantized version of the envelope detector voltage.

16. The method of claim 12, wherein the amplified output signal is a substantially linear replica of the input signal.

17. The method of claim 12, wherein step (c) further comprises selecting the corresponding phase adjustment from a plurality of predetermined phase adjustments, the plurality of predetermined phase adjustments determined from a mapping of a phase response of the power amplifier to a range of variation of the supply voltage.

18. The method of claim 17, wherein the mapping of the phase response is piecewise linear.

19. The method of claim 12, wherein step (c) further comprises selecting the corresponding gain adjustment from a plurality of predetermined gain adjustments, the plurality of predetermined gain adjustments determined from a mapping of an amplitude response of the power amplifier to a range of variation of the supply voltage.

20. The method of claim 19, wherein the mapping of the amplitude response is piecewise linear.

21. The method of claim 12, wherein step (c) and step (d) further comprise:
    selecting the corresponding phase adjustment from a plurality of predetermined phase adjustments in response to the supply voltage, the plurality of predetermined phase adjustments determined from a mapping of a phase response of the power amplifier to a range of variation of the supply voltage;
    modifying a phase component of the input signal using the corresponding phase adjustment to produce an intermediate conditioned input signal;
    selecting the corresponding gain adjustment from a plurality of predetermined gain adjustments in response to the supply voltage, the plurality of predetermined gain adjustments determined from a mapping of an amplitude response of the power amplifier to a range of variation of the supply voltage; and
    modifying a gain component of the intermediate conditioned input signal using the corresponding gain adjustment to produce the conditioned input signal.

22. The method of claim 12, wherein step (c) and step (d) further comprise:
    selecting the corresponding gain adjustment from a plurality of predetermined gain adjustments in response to the supply voltage, the plurality of predetermined gain adjustments determined from a mapping of an amplitude response of the power amplifier to a range of variation of the supply voltage;
    modifying a gain component of the input signal using the corresponding gain adjustment to produce an intermediate conditioned input signal;
    selecting the corresponding phase adjustment from a plurality of predetermined phase adjustments in response to the supply voltage, the plurality of predetermined phase adjustments determined from a mapping of a phase response of the power amplifier to a range of variation of the supply voltage; and
    modifying a phase component of the intermediate conditioned input signal using the corresponding phase adjustment to produce the conditioned input signal.

23. An apparatus for conditioning an input signal to produce a conditioned input signal for power amplification to generate an amplified output signal, the amplified output signal a substantially linear replica of the input signal, the apparatus comprising:
    a first nonlinear mapper operably couplable to a tracking power supply to receive a supply voltage, the supply voltage formed as a substantially quantized replica of a detected envelope of the input signal, the first nonlinear mapper operative to select a corresponding phase adjustment from a plurality of predetermined phase adjustments in response to the supply voltage, the plurality of predetermined phase adjustments determined from a mapping of a phase response of the power amplifier to a range of variation of the supply voltage;
    a phase adjuster coupled to the first nonlinear mapper, the phase adjuster operative to modify a phase component of the input signal using the corresponding phase adjustment to produce an intermediate conditioned input signal;
    a second nonlinear mapper operably couplable to the tracking power supply to receive the supply voltage, the second nonlinear mapper operative to select the corresponding gain adjustment from a plurality of predetermined gain adjustments in response to the supply voltage, the plurality of predetermined gain adjustments determined from a mapping of an amplitude response of the power amplifier to a range of variation of the supply voltage; and
    a gain adjuster coupled to the second nonlinear mapper and to the phase adjuster, the gain adjuster operative to modify a gain component of the intermediate conditioned input signal using the corresponding gain adjustment to produce the conditioned input signal.

24. An apparatus for conditioning an input signal to produce a conditioned input signal for power amplification to generate an amplified output signal, the amplified output signal a substantially linear replica of the input signal, the apparatus comprising:
    a first nonlinear mapper operably couplable to a tracking power supply to receive a supply voltage, the supply voltage formed as a substantially quantized replica of a detected envelope of the input signal, the first nonlinear mapper operative to select a corresponding gain adjustment from a plurality of predetermined gain adjustments in response to the supply voltage, the plurality of predetermined gain adjustments determined from a mapping of an amplitude response of the power amplifier to a range of variation of the supply voltage;

a gain adjuster coupled to the first nonlinear mapper, the gain adjuster operative to modify a gain component of the input signal using the corresponding gain adjustment to produce an intermediate conditioned input signal;

a second nonlinear mapper operably couplable to the tracking power supply to receive the supply voltage, the second nonlinear mapper operative to select a corresponding phase adjustment from a plurality of predetermined phase adjustments in response to the supply voltage, the plurality of predetermined phase adjustments determined from a mapping of a phase response of the power amplifier to a range of variation of the supply voltage; and a phase adjuster coupled to the second nonlinear mapper and to the gain adjuster, the phase adjuster operative to modify a phase component of the intermediate conditioned input signal using the corresponding phase adjustment to produce the conditioned input signal.

25. A system for power amplification of an input signal to produce an amplified output signal, the amplified output signal being a substantially linear replica of the input signal, the system comprising:

an envelope detector, the envelope detector operable to determine an envelope detector voltage from the input signal;

a tracking power supply operably coupled to the envelope detector, the tracking power supply operable to determine a supply voltage as a substantially quantized version of the envelope detector voltage;

a first delay circuit to synchronize the input signal to the supply voltage from the tracking power supply to form a synchronized input signal;

an input signal conditioner operably coupled to the tracking power supply and to the first delay circuit, the input signal conditioner operative, in response to the supply voltage, to determine a corresponding phase adjustment and a corresponding gain adjustment, the input signal conditioner further operative to modify the synchronized input signal using the corresponding phase adjustment and the corresponding gain adjustment to produce a conditioned input signal;

a second delay circuit operably coupled to the tracking power supply to synchronize the supply voltage to the conditioned input signal from the input signal conditioner to form a synchronized supply voltage; and a power amplifier, the power amplifier operably coupled to the second delay circuit for reception of the synchronized supply voltage and operably coupled to the input signal conditioner to amplify the conditioned input signal to produce the amplified output signal.

26. The system of claim 25, wherein the input signal conditioner further comprises:

a first nonlinear mapper operably coupled to the tracking power supply to receive the supply voltage, the first nonlinear mapper operative to select the corresponding phase adjustment from a plurality of predetermined phase adjustments in response to the supply voltage, the plurality of predetermined phase adjustments determined from a piecewise linear mapping of a phase response of the power amplifier to a range of variation of the supply voltage;

a phase adjuster coupled to the first nonlinear mapper, the phase adjuster operative to modify a phase component of the input signal using the corresponding phase adjustment to produce an intermediate conditioned input signal;

a second nonlinear mapper operably coupled to the tracking power supply to receive the supply voltage, the second nonlinear mapper operative to select the corresponding gain adjustment from a plurality of predetermined gain adjustments in response to the supply voltage, the plurality of predetermined gain adjustments determined from a piecewise linear mapping of an amplitude response of the power amplifier to a range of variation of the supply voltage; and a gain adjuster coupled to the second nonlinear mapper and to the phase adjuster, the gain adjuster operative to modify a gain component of the intermediate conditioned input signal using the corresponding gain adjustment to produce the conditioned input signal.

27. The system of claim 25, wherein the input signal conditioner further comprises:

a first nonlinear mapper operably coupled to the tracking power supply to receive the supply voltage, the first nonlinear mapper operative to select the corresponding gain adjustment from a plurality of predetermined gain adjustments in response to the supply voltage, the plurality of predetermined gain adjustments determined from a piecewise linear mapping of an amplitude response of the power amplifier to a range of variation of the supply voltage;

a gain adjuster coupled to the first nonlinear mapper, the gain adjuster operative to modify a gain component of the input signal using the corresponding gain adjustment to produce an intermediate conditioned input signal;

a second nonlinear mapper operably coupled to the tracking power supply to receive the supply voltage, the second nonlinear mapper operative to select the corresponding phase adjustment from a plurality of predetermined phase adjustments in response to the supply voltage, the plurality of predetermined phase adjustments determined from a piecewise linear mapping of a phase response of the power amplifier to a range of variation of the supply voltage; and a phase adjuster coupled to the second nonlinear mapper and to the gain adjuster, the phase adjuster operative to modify a phase component of the intermediate conditioned input signal using the corresponding phase adjustment to produce the conditioned input signal.

* * * * *